(12) United States Patent
Leonard et al.

(10) Patent No.: US 7,777,218 B1
(45) Date of Patent: Aug. 17, 2010

(54) MEMORY CELL CONTAINING COPOLYMER CONTAINING DIARYLACETYLENE PORTION

(75) Inventors: William G. Leonard, Brookline, MA (US); Richard P. Kingsborough, North Chelmsford, MA (US); Igor Sokolik, East Boston, MA (US)

(73) Assignee: Spansion LLC, Sunnyvale, CA (US)

( * ) Notice: Subject to any disclaimer, the term of this patent is extended or adjusted under 35 U.S.C. 154(b) by 998 days.

(21) Appl. No.: 11/462,525

(22) Filed: Aug. 4, 2006

Related U.S. Application Data (62) Division of application No. 11/033,941, filed on Jan. 12, 2005, now Pat. No. 7,105,374.

(51) Int. Cl.
*H01L 35/24* (2006.01)
*H01L 51/00* (2006.01)

(52) U.S. Cl. .................................. 257/40; 257/E39.007
(58) Field of Classification Search ................... 257/40, 257/E39.007
See application file for complete search history.

(56) References Cited

U.S. PATENT DOCUMENTS

| | | | |
|---|---|---|---|
| 6,656,763 B1 | 12/2003 | Oglesby et al. | |
| 6,686,263 B1 | 2/2004 | Lopatin et al. | |
| 6,746,971 B1 | 6/2004 | Ngo et al. | |
| 6,753,247 B1 | 6/2004 | Okoroanyanwu et al. | |
| 6,768,157 B2 | 7/2004 | Krieger et al. | |
| 6,770,905 B1 | 8/2004 | Buynoski et al. | |
| 6,773,954 B1 | 8/2004 | Subramanian et al. | |
| 6,781,868 B2 | 8/2004 | Bulovic et al. | |
| 6,787,458 B1 | 9/2004 | Tripsas et al. | |
| 6,803,267 B1 | 10/2004 | Subramanian et al. | |
| 6,825,060 B1 | 11/2004 | Lyons et al. | |
| 2003/0173612 A1* | 9/2003 | Krieger et al. | 257/304 |
| 2005/0006643 A1* | 1/2005 | Lan et al. | 257/40 |

* cited by examiner

*Primary Examiner*—David A Zarneke
*Assistant Examiner*—Jenny L Wagner
(74) *Attorney, Agent, or Firm*—Turocy & Watson, LLP (57) ABSTRACT

An organic memory cell containing an organic semiconductor layer containing a copolymer is disclosed. The copolymer contains a diarylacetylene portion and at least one of an arylacetylene portion and a heterocyclic acetylene portion. The copolymer may be a random copolymer, an alternating copolymer, a random block copolymer, or a block copolymer. Methods of making an organic memory devices/cells containing the copolymer, methods of using the organic memory devices/cells, and devices such as computers containing the organic memory devices/cells are also disclosed.

20 Claims, 4 Drawing Sheets

MEMORY CELL CONTAINING COPOLYMER CONTAINING DIARYLACETYLENE PORTION

RELATED APPLICATION

This application is a division of co-pending application Ser. No. 11/033,941 filed on Jan. 12, 2005, which is hereby incorporated by reference.

FIELD OF INVENTION

The subject invention relates generally to organic memory cells and, in particular, to organic memory cells containing a copolymer containing a diarylacetylene portion and at least one of an arylacetylene portion and heterocyclic acetylene portion.

BACKGROUND OF THE INVENTION

The basic functions of a computer and memory devices include information processing and storage. In typical computer systems, these arithmetic, logic, and memory operations are performed by devices capable of reversibly switching between two states often referred to as "0" and "1." Such switching devices are fabricated from semiconducting devices that perform these various functions and are capable of switching between two states at high speed.

Electronic addressing or logic devices, for instance for storage or processing of data, are made with inorganic solid-state technology, and particularly crystalline silicon devices. The metal oxide semiconductor field effect transistor (MOSFET) is one the main workhorses.

Much of the progress in making computers and memory devices faster, smaller and cheaper involves integration, squeezing ever more transistors and other electronic structures onto a postage stamp sized piece of silicon. A postage stamp-sized piece of silicon may contain tens of millions of transistors, each transistor as small as a few hundred nanometers. However; silicon-based devices are approaching their fundamental physical size limits.

Inorganic solid-state devices are generally encumbered with a complex architecture that leads to high cost and a loss of data storage density. The circuitry of volatile semiconductor memories based on inorganic semiconductor material must constantly be supplied with electric current with a resulting heating and high electric power consumption in order to maintain stored information. For example, nonvolatile semiconductor devices have a reduced data rate and relatively high power consumption and large degree of complexity.

SUMMARY OF THE INVENTION

The following is a summary of the invention in order to provide a basic understanding of some aspects of the invention. This summary is not intended to identify key/critical elements of the invention or to delineate the scope of the invention. Its sole purpose is to present some concepts of the invention in a simplified form as a prelude to the more detailed description that is presented later.

The subject invention provides an organic memory cell containing a copolymer in an organic semiconductor layer, the copolymer containing a diarylacetylene portion and at least one of an arylacetylene portion and heterocyclic acetylene portion. The subject invention also provides an organic memory cell containing a copolymer containing a diphenylacetylene portion and a phenylacetylene portion. The organic memory cell possesses one or more of the following: small size compared to inorganic memory cells/devices, capability to store multiple bits of information, short resistance/impedance switch time, low operating voltages, low cost, high reliability, long life (thousands/millions of cycles), capable of three dimensional packing, associated low temperature processing, light weight, high density/integration, and extended memory retention.

One aspect of the subject invention relates to a method of making an organic memory cell containing a copolymer in an organic semiconductor layer, the copolymer containing a diarylacetylene portion and at least one of an arylacetylene portion and heterocyclic acetylene portion. The subject invention also relates to a method of making an organic memory cell containing a copolymer containing a diphenylacetylene portion and a phenylacetylene portion. The organic semiconductor layer may be formed by a chemical vapor deposition (CVD) process. The copolymer may be formed by polymerization of diarylacetylene in the presence of at least one of arylacetylene and heterocyclic acetylene.

To the accomplishment of the foregoing and related ends, the invention comprises the features hereinafter fully described and particularly pointed out in the claims. The following description and the annexed drawings set forth in detail certain illustrative aspects and implementations of the invention. These are indicative, however, of but a few of the various ways in which the principles of the invention may be employed. Other objects, advantages and novel features of the invention will become apparent from the following detailed description of the invention when considered in conjunction with the drawings.

DISCLOSURE OF THE INVENTION

The subject invention includes an organic memory cell containing a copolymer in an organic semiconductor layer, the copolymer containing a diarylacetylene portion and at least one of an arylacetylene portion and heterocyclic acetylene portion. The subject invention also includes an organic memory cell containing a copolymer in an organic semiconductor layer, the copolymer containing a diphenylacetylene portion and a phenylacetylene portion. The copolymer may be a random copolymer, an alternating copolymer, a random block copolymer, or a block copolymer containing the diarylacetylene portion and at least one of the arylacetylene portion and heterocyclic acetylene portion.

The subject invention involves a method of making an organic memory cell containing a copolymer in an organic semiconductor layer, the copolymer containing a diarylacetylene portion and at least one of an arylacetylene portion and heterocyclic acetylene portion. The subject invention also more specifically involves a method of aking an organic memory cell containing a copolymer in an organic semiconductor layer, the copolymer containing a diphenylacetylene portion and a phenylacetylene portion. The copolymer exhibits improved thermal stability and improved density compared to polymers made with only one monomer. Since semiconductor processing in general involves numerous acts requiring high temperatures, the improved thermal stability of the copolymer based organic semiconductor layers of the subject invention is a significant advance.

The organic memory cells contain at least two electrodes, as one or more electrodes may be disposed between the two electrodes that sandwich the controllably conductive media. The electrodes are made of conductive material, such as conductive metal, conductive metal alloys, conductive metal oxides, conductive polymer films, semiconductive materials, and the like. The controllably conductive media contains an organic semiconductive layer and passive layer.

The organic memory cells may optionally contain additional layers, such as additional electrodes, charge retention layers, and/or chemically active layers between or in addition to the two electrodes and the controllably conductive media. The impedance of the controllably conductive media changes when an external stimulus such as an applied electric field is imposed. A plurality of organic memory cells, which may be referred to as an array, forms an organic memory device.

An organic semiconductor layer can be formed over a passive layer. The organic semiconductor layer comprises a copolymer that contains a diarylacetylene portion and at least one of an arylacetylene portion and heterocyclic acetylene portion. The formation of the organic semiconductor layer can be carried out by any suitable process, for example a chemical vapor deposition (CVD) process. The copolymer may be a random copolymer, an alternating copolymer, a random block copolymer, or a block copolymer containing the diarylacetylene portion and at least one of the arylacetylene portion and heterocyclic acetylene portion.

Figure 1:
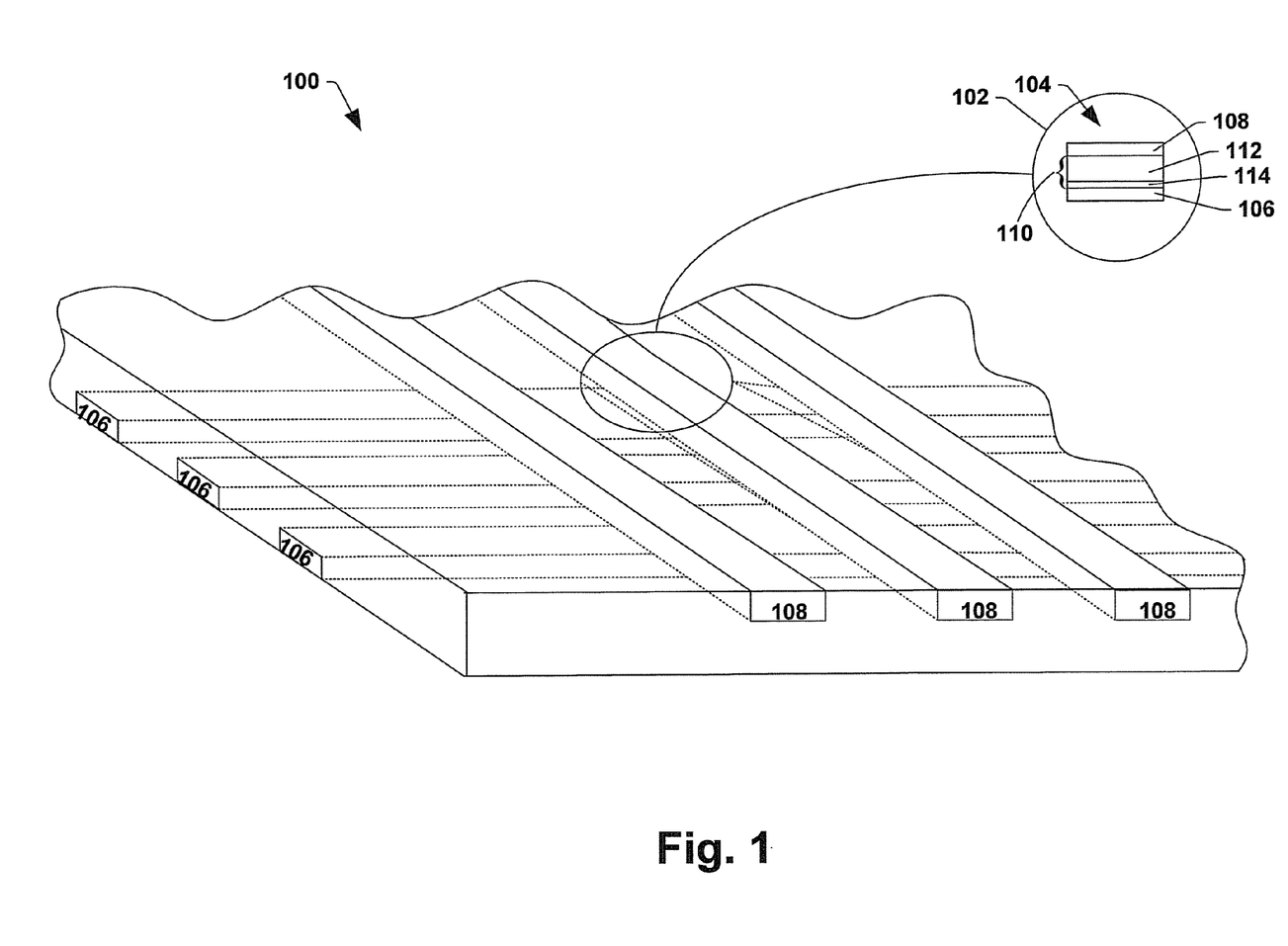
FIG. 1 illustrates a perspective view of a three dimensional microelectronic device containing a plurality of organic memory cells in accordance with one aspect of the invention.

Referring to FIG. 1, a brief description of a microelectronic organic memory device 100 containing a plurality of organic memory cells 104 in accordance with one aspect of the invention is shown, as well as an exploded view 102 of an exemplary organic memory cell 104. The microelectronic organic memory device 100 contains a desired number of organic memory cells, as determined by the number of rows, columns, and layers (three dimensional orientation described later) present. The first electrodes 106 and the second electrodes 108 are shown in substantially perpendicular orientation, although other orientations are possible to achieve the structure of the exploded view 102. Each organic memory cell 104 contains a first electrode 106 and a second electrode 108 with a controllably conductive media 110 therebetween. The controllably conductive media 110 contains an organic semiconductor layer 112 and a passive layer 114. Peripheral circuitry and devices are not shown for brevity.

The organic memory cells 104 contain at least two electrodes, as one or more electrodes may be disposed between the two electrodes that sandwich the controllably conductive media 110. The electrodes are made of conductive material, such as conductive metal, conductive metal alloys, conductive metal oxides, conductive polymer films, semiconductive materials, and the like.

Examples of electrodes include one or more of aluminum, barium, calcium, chromium, cobalt, copper, germanium, gold, magnesium, manganese, molybdenum, indium, iron, nickel, palladium, platinum, silver, titanium, tungsten, zinc, and alloys thereof; indium-tin oxide (ITO) and indium zinc oxide and other conductive metal oxides; polysilicon; doped amorphous silicon; metal silicides, metal carbides, and metal nitrides; and the like. Alloy electrodes specifically include Hastelloy®, Kovar®, Invar, Monel®, Inconel®, brass, stainless steel, magnesium-silver alloy, and various other alloys.

When a copper sulfide passive layer 114 is formed on the surface of an electrode by contacting a sulfur compound with the electrode, the electrode that is adjacent the copper sulfide layer contains at least copper, so as to permit formation of a copper sulfide layer by the sulfur treatment. In one embodiment, the electrode that is adjacent the copper sulfide layer contains at least 50% by weight copper.

The electrode 106, 108 has a suitable thickness that depends upon the chosen implementations and/or the memory device being fabricated. In one embodiment, the thickness of each electrode is independently about 0.01 µm or more and about 10 µm or less. In another embodiment, the thickness of each electrode is independently about 0.05 µm or more and about 5 µm or less. In yet another embodiment, the thickness of each electrode is independently about 0.1 µm or more and about 1 µm or less.

The controllably conductive media 110, disposed between the two electrodes, can be rendered conductive or non-conductive in a controllable manner using an external stimulus. Generally, in the absence of an external stimulus, the controllably conductive media is non-conductive or has high impedance. Further, in some embodiments, multiple degrees of conductivity/resistivity may be established for the controllably conductive media 110 in a controllable manner. For example, the multiple degrees of conductivity/resistivity for the controllably conductive media 110 may include a non-conductive state, a highly conductive state, and a semiconductive state.

The controllably conductive media 110 can be rendered conductive, non-conductive or any state therebetween (degree of conductivity) in a controllable manner by an external stimulus (e.g., originating from outside the controllably conductive media). For example, under an external electric field, radiation, and the like, a given non-conductive controllably conductive media is converted to a conductive controllably conductive media.

The controllably conductive media 110 contains one or more organic semiconductor layers 112 and one or more passive layers. In one embodiment, the controllably conductive media 110 contains at least one organic semiconductor layer 112 that is adjacent a passive layer (without any intermediary layers between the organic semiconductor layer and passive layer).

The organic semiconductor layer 112 comprises a copolymer containing a diarylacetylene portion and at least one of an arylacetylene portion and heterocyclic acetylene portion. The diarylacetylene portion and the arylacetylene portion may independently contain at least one of monocyclic aromatic hydrocarbon group containing from about 6 to about 18 carbon atoms and fused polycyclic aromatic hydrocarbon group.

In one embodiment, the diarylacetylene portion and the arylacetylene portion may independently contain a phenyl group; the diarylacetylene portion may be made from diphenylacetylene and the arylacetylene portion may be made from phenylacetylene. In another embodiment, the diarylacetylene portion and the arylacetylene portion may independently contain fused polycyclic aromatic hydrocarbon group. The diarylacetylene portion and the arylacetylene portion may be respectively made from diarylacetylene and arylacetylene containing the fused polycyclic aromatic hydrocarbon group. Examples of the fused polycyclic aromatic hydrocarbon group may include naphthyl group, anthryl group, phenanthryl group, naphthacenyl group, pyrenyl group, triphenylenyl group, and chrysenyl group. Examples of diarylacetylene containing the fused polycyclic aromatic hydrocarbon group may include phenylnaphthylacetylene, dinaphtylacetylene, and phenylphenanthrylacetylene. Examples of arylacetylene containing the fused polycyclic aromatic hydrocarbon group may include naphthylacetylene, phenanthrylacetylene, and pyrenylacetylene.

The copolymer may include a heterocyclic acetylene portion. Examples of the heterocyclic acetylene portion may include pyridyl, pyridazinyl, pyrimidyl, pyrazinyl, quinolyl, isoquinolyl, quinazolinyl, cinnolinyl, and phthalazinyl group. For example, the heterocyclic acetylene portion may be made from ethynylpyridine, ethynylpyridine, ethynylpyrimidine, ethynylquinoline, or ethynylquinazoline.

At least one of the diarylacetylene portion, the arylacetylene portion, and heterocyclic acetylene portion may have at least one substituted group thereon. For example, the substituted diarylacetylene portion may be made from (t-butyl)diphenylacetylene, (trifluoromethyl)diphenylacetylene, (trimethylsilyl) diphenylacetylene, (carbazole) diphenylacetylene, nitrodiphenylacetylene, methoxydiphenylacetylene, and related substituted diphenylacetylenes and dinaphthylacetylenes. The substituted arylacetylene portion may be made from, for example, p-methylphenylacetylene, p-dodecylphenylacetylene, o-amylphenylacetylene, methylphenylacetylene, methylnaphthylacetylene, hexylnaphthylacetylene, methoxyphenylacetylene, methylphenylacetylene, (t-butyl)phenylacetylene, nitro-phenylacetylene, (trifluoromethyl) phenylacetylene, (trimethylsilyl)phenylacetylene, and p-carbazolephenylacetylene. The substituted heterocyclic acetylene portion may be made from, for example, 2-amino-5-ethynylpyridine, 2-methyl-5-ethynylpyridine, 4-methyl-5-ethynylpyridine, and the like.

The copolymer can be formed by any suitable technique. For example, the copolymer is formed by a chemical vapor deposition (CVD) process. In one embodiment, the copolymer is formed by random polymerization of diarylacetylene in the presence of at least one of arylacetylene and heterocyclic acetylene. The resultant copolymer is a random copolymer containing the diarylacetylene portion and at least one of the arylacetylene portion and heterocyclic acetylene portion. For example, the copolymer is formed by polymerization of diphenylacetylene in the presence of phenylacetylene. In another embodiment, the copolymer is formed by block polymerization of diarylacetylene and at least one of arylacetylene and heterocyclic acetylene. A thin layer containing at least one of arylacetylene portion and heterocyclic acetylene portion is first formed, and then a diarylacetylene is introduced to a reactor and a thin layer of polydiarylacetylene is formed on the thin layer containing at least one of the arylacetylene portion and heterocyclic acetylene portion. The resultant copolymer is a block copolymer containing diarylacetylene portion and at least one of arylacetylene portion and heterocyclic acetylene portion. In yet another embodiment, the copolymer may be an alternating copolymer or a random block copolymer containing the diarylacetylene portion and at least the arylacetylene portion and heterocyclic acetylene portion.

The copolymer has a suitable weight ratio of diarylacetylene portion to portion of arylacetylene and heterocyclic acetylene that depends upon the chosen implementations and/or the memory device being fabricated. In one embodiment, the copolymer contains from about 0.05% to about 99.95% by weight of the diphenylacetylene portion and from about 99.95% to about 0.05% by weight of the arylacetylene and/or the heterocyclic acetylene portion. In another embodiment, the copolymer contains from about 50% to about 99.9% by weight of the diphenylacetylene portion and from about 50% to about 0.1% by weight of the arylacetylene and/or the heterocyclic acetylene portion.

Organic semiconductors thus have a carbon-based structure, often a carbon-hydrogen based structure, which is different from conventional MOSFETs. The organic semiconductor materials are typically characterized in that they have overlapping π orbitals, and/or in that they have at least two stable oxidation states. The organic semiconductor materials are also characterized in that they may assume two or more resonant structures. The overlapping orbitals contribute to the controllably conductive properties of the controllably conductive media 110. The amount of charge injected into the organic semiconductor layer 112 also influences the degree of conductivity of the organic semiconductor layer 112.

The copolymer may contain other conjugated organic portions that were made from a monomer having an acetylene bond in addition to the diarylacetylene portion and at least one of arylacetylene portion and heterocyclic acetylene portion. The conjugated organic polymer may be linear or branched, so long as the polymer retains its conjugated nature. Conjugated polymers are characterized in that they have overlapping π orbitals. Conjugated polymers are also characterized in that they may assume two or more resonant structures. The conjugated nature of the conjugated organic polymer contributes to the controllably conductive properties of the controllably conductive media 110.

The organic semiconductor layer 112 has the ability to donate and accept charges (holes and/or electrons). Generally, the organic semiconductor or an atom/moiety in the polymer has at least two relatively stable oxidation states. The two relatively stable oxidation states permit the organic semiconductor to donate and accept charges and electrically interact with the conductivity-facilitating compound. The ability of the organic semiconductor layer 112 to donate and accept charges and electrically interact with the passive layer also depends on the identity of the conductivity-facilitating compound.

In one embodiment, the organic semiconductor layer 112 is not doped with a salt. In another embodiment, the organic semiconductor layer 112 is doped with a salt. A salt is an ionic compound having an anion and cation. General examples of salts that can be employed to dope the organic semiconductor layer 112 include alkaline earth metal halogens, sulfates, persulfates, nitrates, phosphates, and the like; alkali metal halogens, sulfates, persulfates, nitrates, phosphates, and the like; transition metal halogens, sulfates, persulfates, nitrates, phosphates, and the like; ammonium halogens, sulfates, persulfates, nitrates, phosphates, and the like; quaternary alkyl ammonium halogens, sulfates, persulfates, nitrates, phosphates, and the like.

The organic semiconductor layer 112 has a suitable thickness that depends upon the chosen implementations and/or the memory device being fabricated. In one embodiment, the organic semiconductor layer 112 has a thickness of about 0.001 µm or more and about 5 µm or less. In another embodiment, the organic semiconductor layer 112 has a thickness of about 0.01 µm or more and about 2.5 µm or less. In yet another embodiment, the organic semiconductor layer 112 has a thickness of about 0.05 µm or more and about 1 µm or less.

The organic semiconductor layer 112 may be formed by chemical vapor deposition (CVD) optionally including a gas reaction or gas phase deposition. During formation or deposition, the organic semiconductor material self assembles between the electrodes. It is not typically necessary to functionalize one or more ends of the organic polymer in order to attach it to an electrode/passive layer 114. It is to be appreciated that any suitable organic semiconductor layer formation processes may be employed with the subject invention. Choice of a suitable organic semiconductor layer formation process depends primarily on the identity of the organic semiconductor layer material, size of substrates being processed, and to some extent, the composition of a passive layer or dielectric layer. It is important to understand that each of the various organic semiconductor layer formation processes has its own set of features and characteristics well known in the art.

Any suitable CVD including a gas-phase reaction with the copper sulfide passive layer 114 may be employed with the subject invention. The CVD generally contains a muffle component and a gas delivery component to a chamber. The muffle generates gaseous chemicals containing diarylacetylene, arylacetylene, and/or heterocyclic acetylene. The gas delivery component introduces the gaseous chemicals to the chamber and deposits an organic semiconductor layer 112 on the passive layer 114. In one embodiment, the muffle provides a mixture of gaseous chemicals of diphenylacetylene and phenylacetylene to the chamber and forms random copolymer containing a diphenylacetylene portion and a phenylacetylene portion on the copper sulfide passive layer 114. In yet another embodiment, the muffle first provides gaseous chemicals containing phenylacetylene to the chamber and foams a thin layer of polyphenylacetylene on the copper sulfide passive layer 114, and then the muffle provides gaseous chemicals containing diphenylacetylene to the chamber and forms a thin layer of polydiphenylacetylene on the polyphenylacetylene layer. The resultant copolymer is a block copolymer containing a diphenylacetylene portion and a phenylacetylene portion.

A covalent bond may be formed between the organic semiconductor material 112 and the passive layer 114. Alternatively, close contact is required to provide good charge carrier/electron exchange between the organic semiconductor layer 112 and the passive layer 114. The organic semiconductor layer 112 and the passive layer 114 are electrically coupled in that charge carrier/electron exchange occurs between the two layers.

The passive layer 114 can contain at least one conductivity-facilitating compound that contributes to the controllably conductive properties of the controllably conductive media 110. The conductivity-facilitating compound has the ability to donate and accept charge carriers (ions, holes and/or electrons). The passive layer 114 thus may transport between an electrode and the organic polymer layer/passive layer interface, facilitate charge-carrier injection into the organic polymer layer, and/or increase the concentration of charge carriers in the organic polymer layer. In some instances, the passive layer 114 may store opposite charges thereby providing a balance of charges in the organic memory device as a whole. Storing charges/charge carriers is facilitated by the existence of two relatively stable oxidation states for the conductivity-facilitating compound.

Generally, the conductivity facilitating compound or an atom in the conductivity-facilitating compound has at least two relatively stable oxidation states. The two relatively stable oxidation states permit the conductivity-facilitating compound to donate and accept charges and electrically interact with the organic semiconductor layer 112. The particular conductivity facilitating compound employed in a given organic memory cell is selected so that the two relatively stable oxidation states match with the two relatively stable oxidation states of the organic semiconductor material. Matching the energy bands of two relatively stable oxidation states of the organic semiconductor material and the conductivity facilitating compound facilitate charge carrier retention in the organic semiconductor layer 112.

Matching energy bands means that the Fermi level of the passive layer is close to the valence band of the organic semiconductor layer 112. Consequently, the injected charge carrier (into the organic semiconductor layer) may recombine with the charge at the passive layer if the energy band of the charged organic semiconductor layer 112 does not substantially change. Matching energy bands involves compromising between ease of charge injection and length of charge (data) retention time.

The applied external field can reduce the energy barrier between passive layer 114 and organic layer 112 depending on the field direction. Therefore, enhanced charge injection in the forward direction field in programming operation and also enhanced charge recombination in reversed field in erase operation can be obtained.

The passive layer 114 contains at least copper sulfide. It is noted that the term copper sulfide layer or region in an organic memory cell 104 refers to a portion of a memory element or memory cell that contains $Cu_xS_y$, as a conductivity-facilitating compound. In one embodiment, x and y are independently from about 0.5 to about 4. In another embodiment, x and y are independently from about 0.75 to about 3. Common examples of $Cu_xS_y$ compounds include $Cu_2S_3$, CuS, $Cu_{1.5}S$, $Cu_2S$, $Cu_{2.5}S$, $Cu_3S$, and the like. For simplicity and brevity, all such copper sulfide layers falling within the noted $Cu_xS_y$ formula are generically referred to as copper sulfide layers. The conductivity-facilitating compound does not dissociate into ions under the strength of the electric field. The passive layer 114 may contain two or more sub-passive layers, each sub-layer containing the same, different, or multiple conductivity facilitating compounds.

The copper sulfide passive layer 114 may in some instances act as a catalyst when forming the organic semiconductor layer 112. In one embodiment, the copper sulfide passive layer 114 may facilitate copolymerizing diarylacetylene and at least one of arylacetylene and heterocyclic acetylene. In another embodiment, the copper sulfide passive layer 114 may facilitate forming a polymer containing at least one of an arylacetylene portion and a heterocyclic acetylene portion and then growing polydiarylacetylene. In this connection, the polymer backbone of the conjugated organic polymer may initially form adjacent the passive layer 114, and grow or assemble away in a substantially perpendicular manner relative to the passive layer surface. As a result, the polymer backbones of the conjugated organic polymers are self-aligned in a direction that traverses the two electrodes.

The passive layer 114 may be on/between electrodes grown using oxidation techniques, formed by chemical vapor deposition (CVD) optionally including a gas reaction or gas phase deposition, formed by physical vapor deposition (PVD) including vacuum evaporation, implantation techniques, and sputter deposition, and the like. It is to be appreciated that any suitable passive layer formation processes may be employed with the subject invention. Choice of a suitable passive layer formation process depends primarily on the identity of the passive layer material, size of substrates being processed, and to some extent, the composition of an electrode layer or dielectric layer. It is important to understand that each of the various passive layer formation processes has its own set of features and characteristics well known in the art.

In one embodiment, a passive layer 114 may be formed using CVD techniques. Any suitable passive layer formation components using CVD techniques may be employed with the subject invention. For example, an atmospheric pressure CVD (APCVD), low-pressure CVD (LPCVD), plasma-enhanced CVD (PECVD), high density CVD (HDCVD), or high density plasma (HDP) may be employed.

In one embodiment, a passive layer 114 may be formed by a PECVD. The PECVD typically contains a plasma generating component and a gas delivery component. The PECVD can form various types of passive layer 114 that includes one or more of the following: copper sulfide ($Cu_2S$, CuS) copper oxide (CuO, $Cu_2O$), manganese oxide ($MnO_2$), titanium dioxide ($TiO_2$), indium oxide ($I_3O_4$), silver sulfide ($Ag_2S$, AgS), iron oxide ($Fe_3O_4$), and the like. In accordance with one or more aspects of the subject invention, the PECVD may form a thin film of conductivity facilitating material such as copper sulfide ($Cu_2S$, CuS) on a conductive layer to act as a passive layer 114 and facilitate conductivity between the conductive layer and other layers that will subsequently be formed to contain a stack making up a memory cell. The PECVD introduces a gaseous form of copper sulfide above a first electrode 106, with helium optionally being utilized as a carrier gas, through the gas delivery component. The PECVD may optionally utilize a metal organic gas precursor in the process which facilitates depositing the conductivity facilitating compound at a relative low pressure and temperature conditions (e.g., about 0.2 Pa. and from about 200° C. to about 300° C., respectively). The metal organic precursor can be, for example, chelate Cu (II) diethyldithiocarbamate or $Cu(S_2CN(C_2H_5)_2)_2$ (II).

In one embodiment, the passive layer 114 may be formed using oxidation techniques. For example, a passive layer 114 containing copper sulfide is formed by contacting a sulfide compound with a first electrode 106 containing copper in the following manner. When a copper sulfide layer is employed as a passive layer 114, the copper sulfide layer is formed over a substrate or in memory structure by initially and optionally removing or reducing copper oxide that be present on the structure containing at least copper. The copper oxide structure may be a copper electrode or a copper pad within an electrode, the electrode with a copper pad or copper electrode adjacent to the subsequently formed copper sulfide passive layer 114. Copper oxide tends to be very porous, and thus by removing or reducing copper oxide if present, uniformity in the thickness of the subsequently formed copper sulfide layer and the adhesion between the copper sulfide layer and the organic semiconductor layer 112 is improved. Moreover, removing copper oxide facilitates the formation of a copper sulfide layer with the exposed or upper regions of the structure containing at least copper.

Copper oxide removal or reduction, if performed, is carried out in any suitable manner. In one embodiment, the copper oxide on the structure surface may be removed by contacting a reducing agent such as $NH_3$ with the structure. In another embodiment, the structure containing the copper oxide on the structure surface may be heated at sufficient temperature and for a sufficient period of time to facilitate oxide removal/reduction. When heating the structure containing the copper oxide, the atmosphere contains one or more inert gases, with or without ammonia, and preferably consists essentially of one or more inert gases. In this connection, in one embodiment, when heating the structure containing the copper oxide, the atmosphere contains essentially a nitrogen gas.

After optional copper oxide removal/reduction, a sulfide compound is contacted with the structure containing at least copper to form a copper sulfide layer in a portion of the structure. The copper sulfide may be formed over the entire surface of the structure containing at least copper, or a mask such as a patterned photoresist may cover portions of the surface of the structure, thus limiting copper sulfide formation to the portions of the structure exposed through the openings in the mask.

The sulfide compound is capable of reacting with copper to form a copper sulfide layer within or on the original structure containing at least copper. Sulfide compounds include Group IA element and other suitable sulfides. Examples of sulfide compounds include hydrogen sulfide, lithium sulfide, sodium sulfide, potassium sulfide, ammonium sulfide, and the like.

The sulfide compound is contacted with the structure containing at least copper in the form of a sulfide compound mixture. In one embodiment, the sulfide compound mixture contains from about 0.1% to about 100% by weight of at least one sulfide compound and from about 0% to about 99.9% by weight of at least one inert gas. For example, the sulfide compound mixture may contain about 2% by weight of at least one sulfide compound and about 98% by weight of at least one inert gas.

The sulfide compound is contacted with the structure containing at least copper for a time at a temperature and at a pressure sufficient to facilitate formation of a layer of copper sulfide in a portion of the structure. In one embodiment, the sulfide compound is contacted with the structure containing at least copper for a time from about 1 second to about 60 minutes at a temperature from about 15° C. to about 500° C. and at a pressure from about 0.0001 Torr to about 1,000 Torr.

The passive layer 114 has a suitable thickness that depends upon the chosen implementations and/or the memory device being fabricated. In one embodiment, the passive layer 114 containing the conductivity facilitating compound has a thickness of about 2 Å or more and about 0.1 μm or less. In another embodiment, the passive layer 114 has a thickness of about 10 Å or more and about 0.01 μm or less. In yet another embodiment, the passive layer 114 has a thickness of about 50 Å or more and about 0.05 μm or less.

In order to facilitate operation of the organic memory cells 104, the organic semiconductor layer 112 is thicker than the passive layer 114. In one embodiment, the thickness of the organic semiconductor layer 112 is from about 10 to about 500 times greater than the thickness of the passive layer 114. In another embodiment, the thickness of the organic semiconductor layer 112 is from about 20 to about 100 times greater than the thickness of the passive layer 114.

The area size of the individual organic memory cells 104 (as measured by the surface area of the two electrodes directly overlapping each other) can be small compared to conventional silicon based inorganic memory cells such as metal oxide semiconductor field effect transistors (MOSFETs). In one embodiment, the area size of the organic memory cells 104 of the subject invention is about 0.0001 $\mu m^2$ or more and about 4 $\mu m^2$ or less. In another embodiment, the area size of the organic memory cells 104 is about 0.001 $\mu m^2$ or more and about 1 $\mu m^2$ or less.

Operation of the organic memory devices/cells is facilitated using an external stimuli to achieve a switching effect. The external stimuli include an external electric field and/or light radiation. Under various conditions, the organic memory cell 104 is either conductive (low impedance or "on" state) or non-conductive (high impedance or "off" state).

The organic memory cell 104 may further have more than one conductive or low impedance state, such as a very highly conductive state (very low impedance state), a highly conductive state (low impedance state), a conductive state (medium level impedance state), and a non-conductive state (high impedance state) thereby enabling the storage of multiple bits of information in a single organic memory cell 104, such as 2 or more bits of information or 4 or more bits of information.

Switching the organic memory cell 104 to the "on" state from the "off" state occurs when an external stimuli such as an applied electric field exceeds a threshold value $V_{on}$. Switching the organic memory cell 104 to the "off" state from the "on" state occurs when an absolute value of external stimuli exceeds an absolute value of another threshold $V_{off}$. The threshold values vary depending upon a number of factors including the identity of the materials that constitute the organic memory cell 104 and the passive layer 114, the thickness of the various layers, and the like.

Generally speaking, the presence of an external stimuli such as an applied electric field that exceeds a threshold value $V_{on}$ permits an applied voltage to write and that is less than threshold value $V_{off}$ to erase information into/from the organic memory cell 104 and the presence of an external stimuli such as an applied electric field that is less than $V_{on}$ but more than $V_{off}$ permits an applied voltage to read information from the organic memory cell 104.

To write information into the organic memory cell 104, a voltage or pulse signal that exceeds the threshold is applied. To read information written into the organic memory cell 104, a voltage or electric field of any polarity is applied. Measuring the impedance determines whether the organic memory cell 104 is in a low impedance state or a high impedance state (and thus whether it is "on" or "off"). To erase information written into the organic memory cell 104, a negative voltage or a polarity opposite the polarity of the writing signal that exceeds a threshold value is applied.

The organic memory devices described herein can be employed to form logic devices such as central processing units (CPUs); volatile memory devices such as DRAM devices, SRAM devices, and the like; input/output devices (I/O chips); and non-volatile memory devices such as EEPROMs, EPROMs, PROMs, and the like. The organic memory devices may be fabricated in planar orientation (two dimensional) or three-dimensional orientation containing at least two planar arrays of the organic memory cells 104.

In the subject invention, an organic semiconductor layer 112 contains a copolymer, the copolymer containing a diarylacetylene portion and at least one of an arylacetylene portion and heterocyclic acetylene portion. The organic semiconductor layer 112 has an enhanced thermal stability because of a high thermal stability of the diarylacetylene portion in the organic semiconductor layer 112. Therefore, the organic semiconductor layer allows organic memory cells to withstand high temperatures of subsequent processes such as metal layer deposition, thus improving productivity and quality of organic memory devices.

Figure 2:
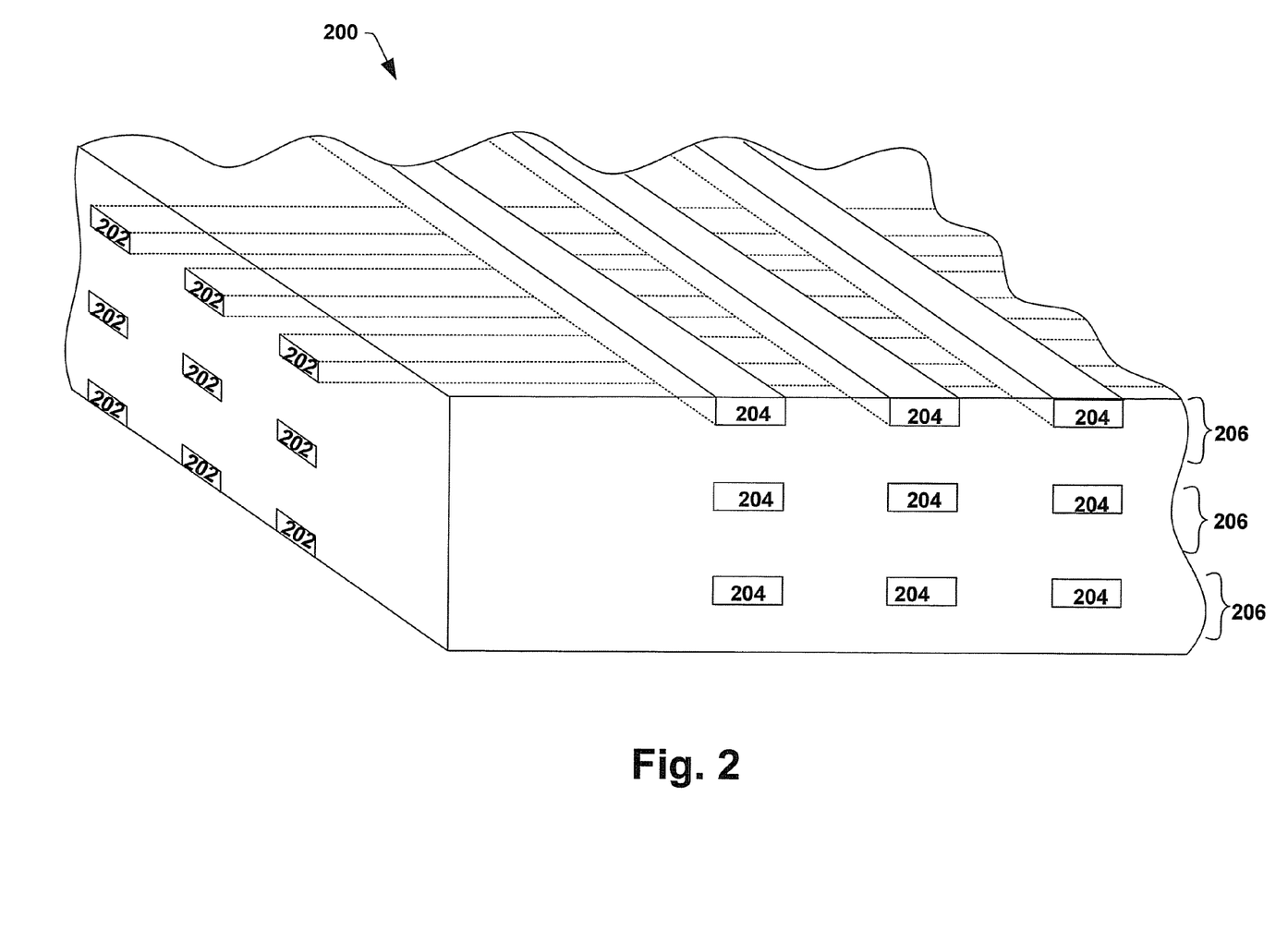
FIG. 2 illustrates a perspective view of a three dimensional microelectronic device containing a plurality of organic memory cells in accordance with another aspect of the invention.
Figure 3:
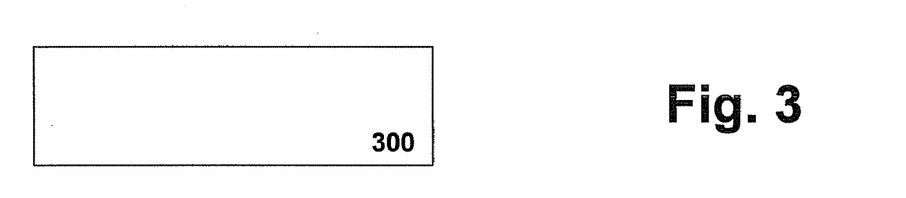
FIG. 3 shows a cross sectional view of forming an organic memory cell in accordance with one aspect of the invention.

Referring to FIG. 2, a three-dimensional microelectronic organic memory device 200 containing a plurality of organic memory cells in accordance with an aspect of the invention is shown. The three-dimensional microelectronic organic memory device 200 contains a plurality of first electrodes 202, a plurality of second electrodes 204, and a plurality of memory cell layers 206. Between the respective first and second electrodes are the controllably conductive media (not shown). The plurality of first electrodes 202 and the plurality of second electrodes 204 are shown in substantially perpendicular orientation, although other orientations are possible. The three-dimensional microelectronic organic memory device is capable of containing an extremely high number of memory cells thereby improving device density. Peripheral circuitry and devices are not shown for brevity.

The impedance of the controllably conductive media changes when an external stimulus such as an applied electric field is imposed. A plurality of organic memory cells, which may be referred to as an array, forms an organic memory device. In this connection, organic memory cells may form an organic memory devices and function in a manner analogous to MOSFETs in conventional semiconductor memory devices.

Referring to FIGS. 3 to 7 and FIGS. 8 to 11, two of many possible exemplary embodiments of forming a memory cell in accordance with the subject invention are illustrated. Specifically referring to FIG. 3, an electrode 300 containing at least copper is provided in this example. The electrode 300 may be a layer of copper or a copper alloy layer.

Figure 4:
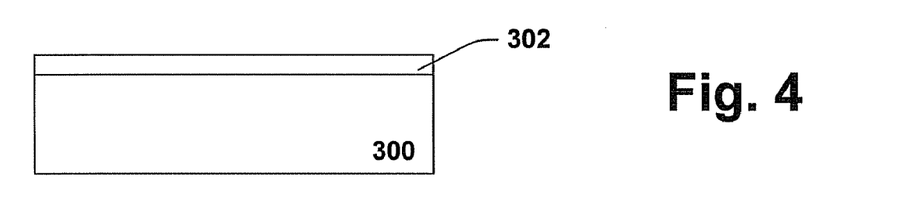
FIG. 4 shows a cross sectional view of forming an organic memory cell in accordance with one aspect of the invention.

Referring to FIG. 4, a copper oxide layer 302 may form over the electrode 300 containing at least copper. Often times, the thickness of the copper oxide layer 302 is a function of time when the electrode 300 containing copper is exposed to the ambient atmosphere. That is, oxygen normally present in air can oxidize the surface of a copper or copper alloy metal.

Figure 5:
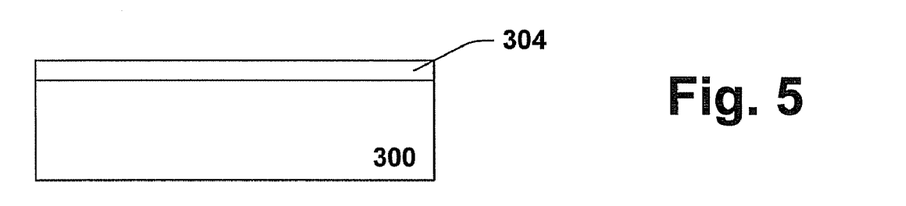
FIG. 5 shows a cross sectional view of foaming an organic memory cell in accordance with one aspect of the invention.

Referring to FIG. 5, the structure is heated to a temperature of about 400° C. for 15 seconds in a gas atmosphere containing essentially of $NH_3$ to remove the copper oxide layer 302 from the electrode 300 containing copper. After the copper oxide layer 302 is removed, within the same chamber, a sulfide compound mixture containing about 10% by weight of hydrogen sulfide and about 90% by weight of nitrogen is contacted with the electrode 300 for a time from about 25 minutes at a temperature about 50° C. to form a copper sulfide region 304 within the electrode 300. The copper oxide reduction/removal is optional in the sense that the copper sulfide region may be formed in the electrode 300 containing copper before copper oxide forms on the electrode 300 surface.

Figure 6:
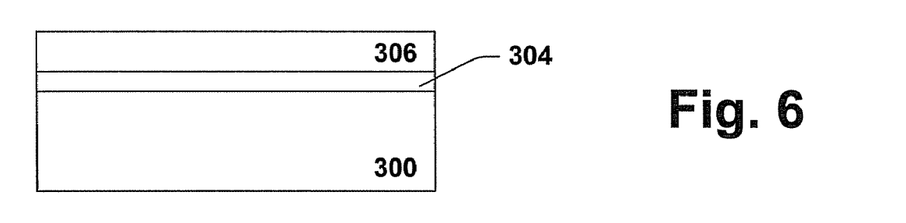
FIG. 6 shows a cross sectional view of forming an organic memory cell in accordance with one aspect of the invention.

Referring to FIG. 6, an organic semiconductor layer 306 containing a copolymer containing a diphenylacetylene portion and at least one of an arylacetylene portion and heterocyclic acetylene portion is formed over the copper sulfide region 304 using CVD techniques. The copolymer contains from about 0.05% to about 99.95% by weight of diarylacetylene portion and from about 99.95% to about 0.05% by weight of the arylacetylene portion and heterocyclic acetylene portion. For example, an organic semiconductor layer 306 containing a random copolymer containing about 95% by weight of diphenylacetylene portion and 5% by weight of phenylacetylene portion is formed over the copper sulfide region 304 using CVD techniques. The organic semiconductor layer 306 has a thickness of about 1000 Å in this example.

Figure 7:
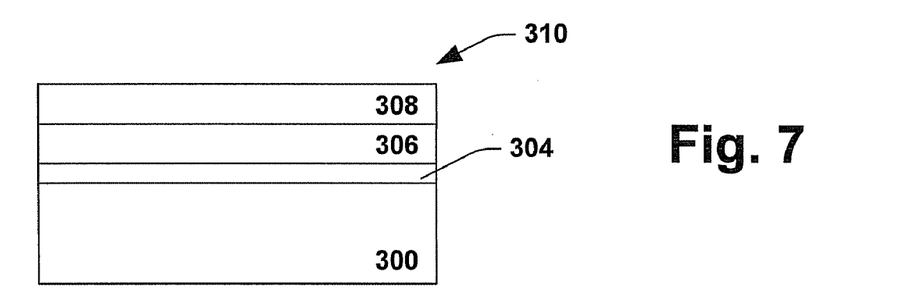
FIG. 7 shows a cross sectional view of forming an organic memory cell in accordance with one aspect of the invention.

Referring to FIG. 7, another electrode 308 is formed over the organic semiconductor layer 306 to provide organic memory cell 310. In this example, the electrode 308 contains aluminum.

Figure 8:
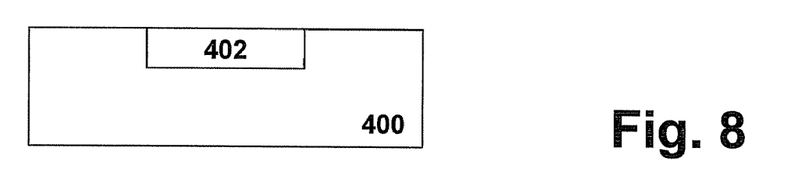
FIG. 8 shows a cross sectional view of forming an organic memory cell in accordance with one aspect of the invention.

Referring to FIG. 8, a structure 400 containing a first electrode 402 is provided. In this example, the first electrode 402 is a substrate containing at least copper. The structure 400 may be a layer of a dielectric.

Figure 9:
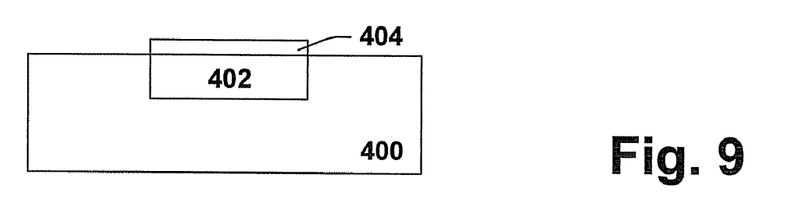
FIG. 9 shows a cross sectional view of forming an organic memory cell in accordance with one aspect of the invention.

Referring to FIG. 9, a copper oxide layer 404 may form over the first electrode 402. Often times, the thickness of the copper oxide layer 404 is a function of time when the first electrode 402 is exposed to the ambient atmosphere. That is, oxygen normally present in air can oxidize the surface of a copper or copper alloy metal.

Figure 10:
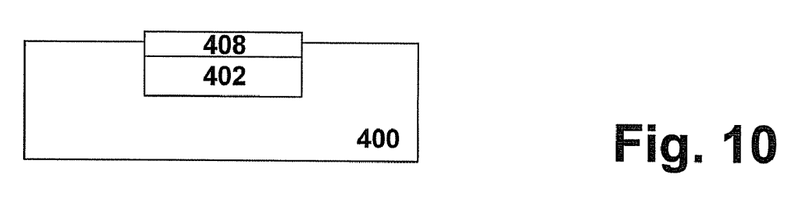
FIG. 10 shows a cross sectional view of forming an organic memory cell in accordance with one aspect of the invention.

Referring to FIG. 10, the structure is heated to a temperature of about 410° C. for 15 seconds in a gas atmosphere containing essentially $NH_3$ to remove the copper oxide layer 404 from the first electrode 402. After the copper oxide layer 404 is removed, a sulfide compound mixture containing about 2% by weight of hydrogen sulfide and about 98% by weight of nitrogen is contacted with the first electrode 402 for about 25 minutes at a temperature of about 75° C. to form the copper sulfide region 408.

Figure 11:
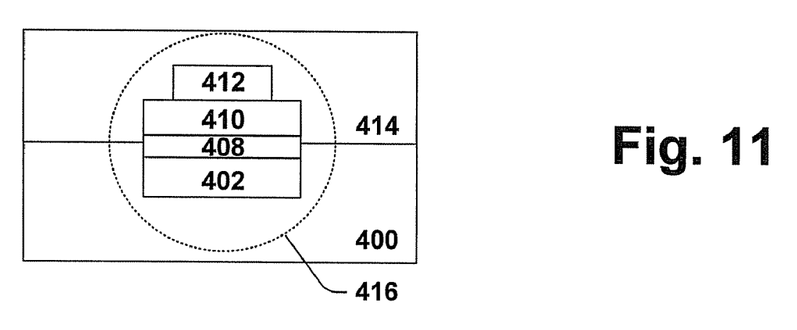
FIG. 11 shows a cross sectional view of foaming an organic memory cell in accordance with one aspect of the invention.

Referring to FIG. 11, an organic semiconductor layer 410 containing a copolymer containing a diphenylacetylene portion and at least one of an arylacetylene portion and heterocyclic acetylene portion is formed over the copper sulfide region 408 using CVD techniques. The copolymer contains from about 0.05% to about 99.95% by weight of the diarylacetylene portion and from about 99.95% to about 0.05% by weight of the arylacetylene portion and heterocyclic acetylene portion. For example, the organic semiconductor layer 410 is a two-layer block copolymer that is made by first forming a thin polyphenylacetylene layer over the copper sulfide region 408 using CVD techniques and then by forming polydiphenylacetylene layer on the polyphenylacetylene layer. The block copolymer contains about 95% by weight of diphenylacetylene portion and 5% by weight of phenylacetylene portion. The organic semiconductor layer 410 has a thickness of about 1000 Å in this example.

A second electrode 412 is formed over the organic semiconductor layer 410. In this example, the electrode 412 contains aluminum. A dielectric encasement layer 414 is foamed thereover. Consequently, organic memory cell 416 is provided.

The organic memory cells/devices are useful in any device requiring memory. For example, the organic memory devices are useful in computers, appliances, industrial equipment, hand-held devices, telecommunications equipment, medical equipment, research and development equipment, transportation vehicles, radar/satellite devices, and the like. Hand-held devices, and particularly hand-held electronic devices, achieve improvements in portability due to the small size and lightweight of the organic memory devices. Examples of hand-held devices include cell phones and other two way communication devices, personal data assistants, palm pilots, pagers, notebook computers, remote controls, recorders (video and audio), radios, small televisions and web viewers, cameras, and the like.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.), the teams (including any reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application.

What is claimed is:

1. An organic memory cell comprising:
a first electrode and a second electrode;
a controllably conductive media between the first and second electrodes, the controllably conductive media comprising a passive layer comprising at least copper sulfide and an organic semiconductor layer, the organic semiconductor layer comprising a copolymer comprising a diarylacetylene portion and at least one of an arylacetylene portion and a heterocyclic acetylene portion,
wherein the copolymer is formed by polymerization of at least a diarylacetylene in the presence of at least one selected from an arylacetylene and a heterocyclic acetylene.

2. The organic memory cell of claim 1, wherein the first electrode comprises at least copper.

3. The organic memory cell of claim 1, wherein the copolymer is a random copolymer, an alternating copolymer, a random block copolymer, or a block copolymer.

4. The organic memory cell of claim 1, wherein the diarylacetylene portion and the arylacetylene portion independently comprises at least one of monocyclic aromatic hydrocarbon group consisting of 6 to 18 carbon atoms and fused polycyclic aromatic hydrocarbon group.

5. The organic memory cell of claim 1, wherein the heterocyclic acetylene portion comprises at least one selected from the group consisting of a pyridyl group, a pyridazinyl group, a pyrimidyl group, a pyrazinyl group, a quinolyl group, an isoquinolyl group, a quinazolinyl group, a cinnolinyl group, and a phthalazinyl group.

6. The organic memory cell of claim 1, wherein at least one of the diarylacetylene portion, the arylacetylene portion, and the heterocyclic acetylene portion has at least one substituted group thereon.

7. The organic memory cell of claim 4, wherein the monocyclic aromatic hydrocarbon group is a phenyl group.

8. The organic memory cell of claim 4, wherein the fused polycyclic aromatic hydrocarbon group comprises at least one selected from the group consisting of a naphthyl group, an anthryl group, a phenanthryl group, a naphthacenyl group, a pyrenyl group, a triphenylenyl group, and a chrysenyl group.

9. The organic memory cell of claim 1, wherein the copolymer comprises a diphenylacetylene portion and a phenylacetylene portion.

10. The organic memory cell of claim 1, wherein the copolymer comprises from about 0.05% to about 99.95% by weight of the diarylacetylene portion and from about 99.95% to about 0.05% by weight of at least one of the arylacetylene portion and the heterocyclic acetylene portion.

11. The organic memory cell of claim 1, wherein the copolymer comprises from about 50% to about 99.9% by weight of the diarylacetylene portion and from about 50% to about 0.1% by weight of at least one of the arylacetylene portion and the heterocyclic acetylene portion.

12. The organic memory cell of claim 1, wherein the organic semiconductor layer has a thickness of about 0.001 μm or more and about 5 μm or less and the passive layer has a thickness of about 2 Å or more and about 0.1 μm or less.

13. A hand held device comprising the organic memory cell of claim 1.

14. A memory device comprising a plurality of memory cells, the plurality of memory cells comprising:
a first electrode and a second electrode;

a controllably conductive media between the first and second electrodes, the controllably conductive media comprising a passive layer comprising at least copper sulfide and an organic semiconductor layer, the organic semiconductor layer comprising a copolymer comprising a diarylacetylene portion and at least one of an arylacetylene portion and a heterocyclic acetylene portion, wherein the copolymer is formed by polymerization of at least a diarylacetylene in the presence of at least one selected from an arylacetylene and a heterocyclic acetylene.

15. The memory device of claim 14, wherein the copolymer comprises a diphenylacetylene portion and a phenylacetylene portion.

16. The memory device of claim 14, wherein the copolymer comprises from about 0.05% to about 99.95% by weight of the diarylacetylene portion and from about 99.95% to about 0.05% by weight of at least one of the arylacetylene portion and the heterocyclic acetylene portion.

17. The memory device of claim 14, wherein the first electrode comprises at least copper.

18. The memory device of claim 14, wherein the diarylacetylene portion and the arylacetylene portion independently comprises at least one of monocyclic aromatic hydrocarbon group consisting of 6 to 18 carbon atoms and fused polycyclic aromatic hydrocarbon group.

19. A hand held device comprising the memory device of claim 14.

20. A cell phone comprising the memory device of claim 14.

* * * * *